(12) United States Patent
Maki

(10) Patent No.: US 9,019,024 B2
(45) Date of Patent: Apr. 28, 2015

(54) QUANTUM INTERFERENCE DEVICE, ATOMIC OSCILLATOR, AND MOVING OBJECT

(71) Applicant: Seiko Epson Corporation, Tokyo (JP)

(72) Inventor: Yoshiyuki Maki, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/177,497

(22) Filed: Feb. 11, 2014

(65) Prior Publication Data

US 2014/0232479 A1    Aug. 21, 2014

(30) Foreign Application Priority Data

Feb. 18, 2013  (JP) ................. 2013-029167

(51) Int. Cl.
*H03L 7/26* (2006.01)
*G04F 5/14* (2006.01)
*H01S 1/06* (2006.01)

(52) U.S. Cl.
CPC .. *H03L 7/26* (2013.01); *G04F 5/14* (2013.01); *H01S 1/06* (2013.01)

(58) Field of Classification Search
CPC ............. H03B 17/00; H03L 7/26; G04F 5/14; G04F 5/145
USPC .......................... 331/3, 68–70, 94.1
See application file for complete search history.

(56) References Cited

U.S. PATENT DOCUMENTS

| | | | |
|---|---|---|---|
| 4,494,085 A * | 1/1985 | Goldberg ................. | 331/94.1 |
| 5,670,914 A * | 9/1997 | Liberman et al. ......... | 331/94.1 |
| 8,067,990 B2 * | 11/2011 | Chindo et al. ............. | 331/94.1 |
| 2003/0146796 A1 * | 8/2003 | Matsuura et al. .......... | 331/94.1 |
| 2005/0184815 A1 * | 8/2005 | Lipp et al. ................. | 331/94.1 |
| 2007/0146085 A1 * | 6/2007 | Koyama .................... | 331/94.1 |
| 2008/0267232 A1 * | 10/2008 | DeNatale ................... | 372/27 |
| 2010/0102893 A1 * | 4/2010 | Chindo et al. ............. | 331/94.1 |
| 2011/0297852 A1 | 12/2011 | Kameda et al. | |
| 2013/0015920 A1 * | 1/2013 | Sato et al. ................. | 331/94.1 |

FOREIGN PATENT DOCUMENTS

| | | |
|---|---|---|
| JP | 03-014303 | 1/1991 |
| JP | 05-198430 | 8/1993 |
| JP | 11-337914 | 12/1999 |
| JP | 2002-314339 A | 10/2002 |
| JP | 2004-048454 A | 2/2004 |
| JP | 2005-259354 A | 9/2005 |
| JP | 2007-036555 A | 2/2007 |
| JP | 2007-336136 A | 12/2007 |

(Continued)

OTHER PUBLICATIONS

Kitching, J., et al. "Microfabricated Atomic Frequency References", The University of Colorado, pp. 1-6, 2004.

*Primary Examiner* — Levi Gannon
(74) *Attorney, Agent, or Firm* — Harness, Dickey & Pierce, P.L.C.

(57) ABSTRACT

An atomic oscillator includes: a gas cell which includes two window portions having a light transmissive property and in which metal atoms are sealed; a light emitting portion that emits excitation light to excite the metal atoms in the gas cell; a light detecting portion that detects the excitation light transmitted through the gas cell; a heater that generates heat; and a connection member that thermally connects the heater and each window portion of the gas cell to each other.

12 Claims, 13 Drawing Sheets

(56) References Cited

FOREIGN PATENT DOCUMENTS

| | | |
|---|---|---|
| JP | 2009-164332 A | 7/2009 |
| JP | 2009-302706 A | 12/2009 |
| JP | 2010-109411 A | 5/2010 |
| JP | 2011-222958 A | 11/2011 |
| WO | WO-2006017345 A2 | 2/2006 |

* cited by examiner

QUANTUM INTERFERENCE DEVICE, ATOMIC OSCILLATOR, AND MOVING OBJECT

BACKGROUND

1. Technical Field

The present invention relates to a quantum interference device, an atomic oscillator, and a moving object.

2. Related Art

An atomic oscillator that oscillates based on the energy transition of atoms of alkali metal, such as rubidium and cesium, is known. In general, the operating principle of the atomic oscillator is largely divided into a method using a double resonance phenomenon caused by light and a microwave and a method using coherent population trapping (CPT) caused by two types of light components having different wavelengths.

In the atomic oscillator of any method, in order to seal alkali metal in a gas cell together with buffer gas and keep the alkali metal in a gas state, it is necessary to heat the gas cell to a predetermined temperature. In addition, excitation light for exciting the alkali metal is emitted into the gas cell, and the intensity of the excitation light transmitted through the gas cell is detected.

In general, in the gas cell, all of the alkali metal is not gasified, but a part of the alkali metal is present as liquid as a surplus. The surplus alkali metal is liquefied by being deposited (condensed) on a low-temperature portion of the gas cell.

When such surplus alkali metal atoms are present in the excitation light passage area, the alkali metal atoms block the excitation light. As a result, the oscillation characteristics of the atomic oscillator are degraded.

Therefore, for example, in an atomic oscillator disclosed in JP-A-2009-302706, a plurality of heaters are disposed on each of the excitation light incidence surface and the excitation light emission surface of the gas cell in which gaseous metal atoms are sealed.

In the atomic oscillator disclosed in JP-A-2009-302706, however, since the heaters are disposed next to the gas cell, there has been a problem in that an unnecessary magnetic field generated in the heaters by current application acts on the alkali metal in the gas cell and this degrades the oscillation characteristics. In particular, when a plurality of heaters are provided, if the amount of current application to each heater is changed to keep the temperature in the gas cell constant, the above-problem becomes noticeable since not only the magnitude but also the direction of the unnecessary magnetic field is changed.

In addition, in the atomic oscillator disclosed in JP-A-2009-302706, since a plurality of heaters are provided, for example, the number of wiring lines to the heaters is increased. As a result, there has also been a problem in that the entire atomic oscillator becomes large.

SUMMARY

An advantage of some aspects of the invention is to provide a quantum interference device and an atomic oscillator that can be miniaturized and can suppress the influence of an unnecessary magnetic field from a heating portion, which generates heat by current application, on a gas cell and to provide a moving object with excellent reliability that includes the atomic oscillator.

The invention can be implemented as the following forms or application examples.

APPLICATION EXAMPLE 1

This application example is directed to a quantum interference device including: a gas cell including two window portions having a light transmissive property and a side wall that seals metal atoms together with the two window portions; a light emitting portion that emits light that is transmitted through one of the window portions to excite the metal atoms; a light detecting portion that detects the light passing through the metal atoms and transmitted through the other window portion; a heating portion that generates heat; and a connection member that includes a material having a larger thermal conductivity than a material forming the side wall and that thermally connects the heating portion and each of the two window portions to each other.

According to the quantum interference device, since the heating portion is thermally connected to each of the two window portions of the gas cell through the connection member, heat from the heating portion can be transmitted to each window portion by thermal conduction using the connection member. As a result, each window portion can be heated. In addition, the heating portion and the gas cell can be separated from each other. Accordingly, it is possible to suppress a situation where the unnecessary magnetic field caused by the application of current to the heating portion has an adverse effect on the metal atoms in the gas cell. In addition, since the number of heating portions can be reduced, the number of wiring lines for the application of current to the heating portion can be reduced. As a result, it is possible to miniaturize the quantum interference device.

APPLICATION EXAMPLE 2

This application example is directed to a quantum interference device including: a gas cell including two window portions having a light transmissive property and a side wall that seals metal atoms together with the two window portions; a light emitting portion that emits light that is transmitted through one of the window portions to excite the metal atoms; a light detecting portion that detects the light passing through the metal atoms and transmitted through the other window portion; a heating portion that generates heat; and a connection member that contains a material having a larger thermal conductivity than a material forming the side wall and is connected to the two window portions, a part of the connection member facing the heating portion.

According to the quantum interference device, since the heating portion faces apart of the connection member, heat from the heating portion can be transmitted to the connection member. In addition, since the connection member is connected to each of the two window portions of the gas cell, heat from the heating portion can be transmitted to each window portion by thermal conduction using the connection member. As a result, each window portion can be heated. In addition, the heating portion and the gas cell can be separated from each other. Accordingly, it is possible to suppress a situation where the unnecessary magnetic field caused by the application of current to the heating portion has an adverse effect on the metal atoms in the gas cell. In addition, since the number of heating portions can be reduced, the number of wiring lines for the application of current to the heating portion can be reduced. As a result, it is possible to miniaturize the quantum interference device.

APPLICATION EXAMPLE 3

In the quantum interference device according to the application example, it is preferable that a heat transfer layer, which contains a material having a larger thermal conductivity than a material that forms each of the window portions, is disposed on a surface of each of the window portions.

With this configuration, heat from the connection member can be efficiently diffused by thermal conduction using the heat transfer layer. As a result, it is possible to make the temperature distribution of each window portion uniform.

APPLICATION EXAMPLE 4

In the quantum interference device according to the application example, it is preferable that each of the window portions and the connection member is connected to each other through the heat transfer layer.

With this configuration, heat from the connection member can be efficiently transferred to each window portion.

APPLICATION EXAMPLE 5

In the quantum interference device according to the application example, it is preferable that the connection member has a pair of connection portions, which are provided with the gas cell interposed therebetween in a direction in which the two window portions are aligned, and a connecting portion that connects the pair of connection portions to each other.

With this configuration, heat from the heating portion can be efficiently transferred to each window portion.

APPLICATION EXAMPLE 6

In the quantum interference device according to the application example, it is preferable that the connecting portion has a portion separated from the gas cell.

With this configuration, since the transfer of heat between the connecting portion and the gas cell can be suppressed, heat can be efficiently transferred from the connection member to each window portion.

APPLICATION EXAMPLE 7

In the quantum interference device according to the application example, it is preferable that the connection member contains a soft magnetic material, and at least a part of the connection member is disposed between the gas cell and the heating portion.

With this configuration, it is possible to prevent a magnetic field from the heating portion from reaching the gas cell.

APPLICATION EXAMPLE 8

In the quantum interference device according to the application example, it is preferable that the heating portion is separated from the gas cell.

With this configuration, it is possible to suppress a situation where the unnecessary magnetic field caused by the application of current to the heating portion has an adverse effect on the metal atoms in the gas cell.

APPLICATION EXAMPLE 9

This application example is directed to an atomic oscillator including the quantum interference device described above.

With this configuration, it is possible to provide an atomic oscillator that can be miniaturized and can suppress the influence of an unnecessary magnetic field from the heating portion, which generates heat by current application, on the gas cell.

APPLICATION EXAMPLE 10

This application example is directed to a moving object including the quantum interference device described above.

With this configuration, it is possible to provide a moving object having excellent reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a quantum interference device, an atomic oscillator, and a moving object according to the invention will be described in detail based on the embodiments with reference to the accompanying diagrams.

1. Atomic Oscillator (Quantum Interference Device)

First, an atomic oscillator according to the invention (atomic oscillator including a quantum interference device according to the invention) will be described. In addition, an example where the quantum interference device according to the invention is applied to an atomic oscillator will be described below. However, the quantum interference device according to the invention is not limited thereto, and can be applied to, for example, a magnetic sensor and a quantum memory as well as the atomic oscillator.

First Embodiment

Figure 1:
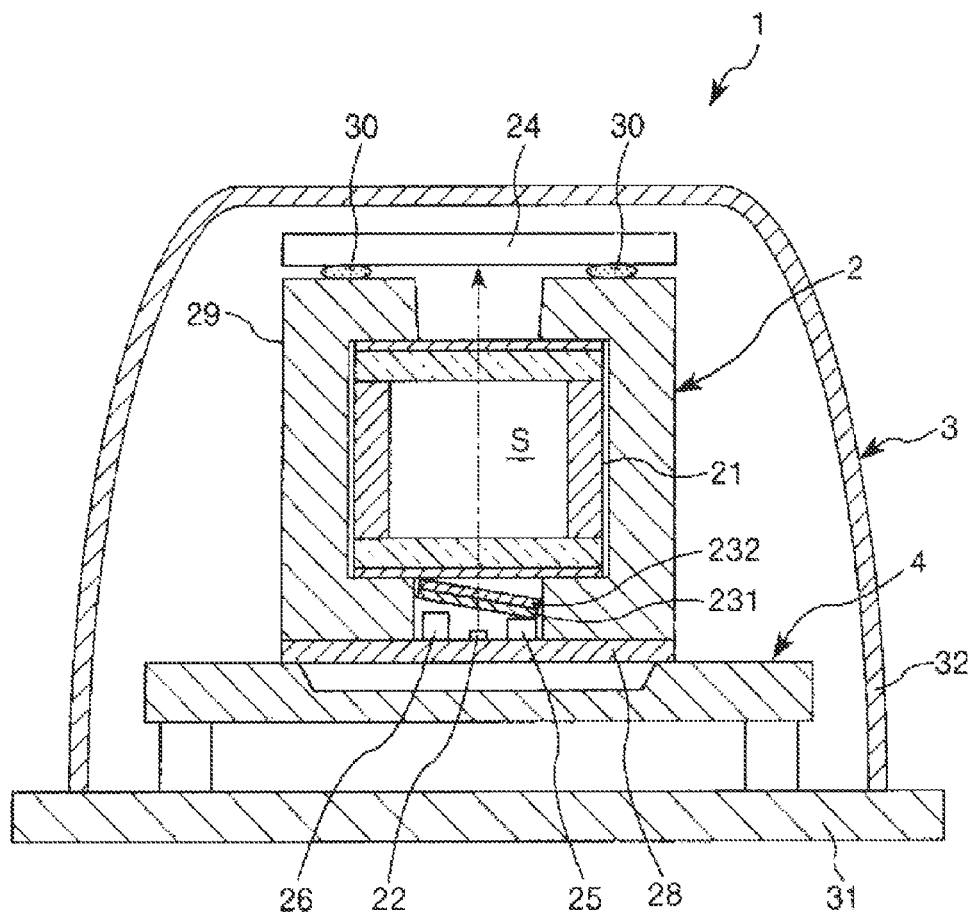
FIG. 1 is a cross-sectional view showing an atomic oscillator (quantum interference device) according to a first embodiment of the invention.
Figure 2:
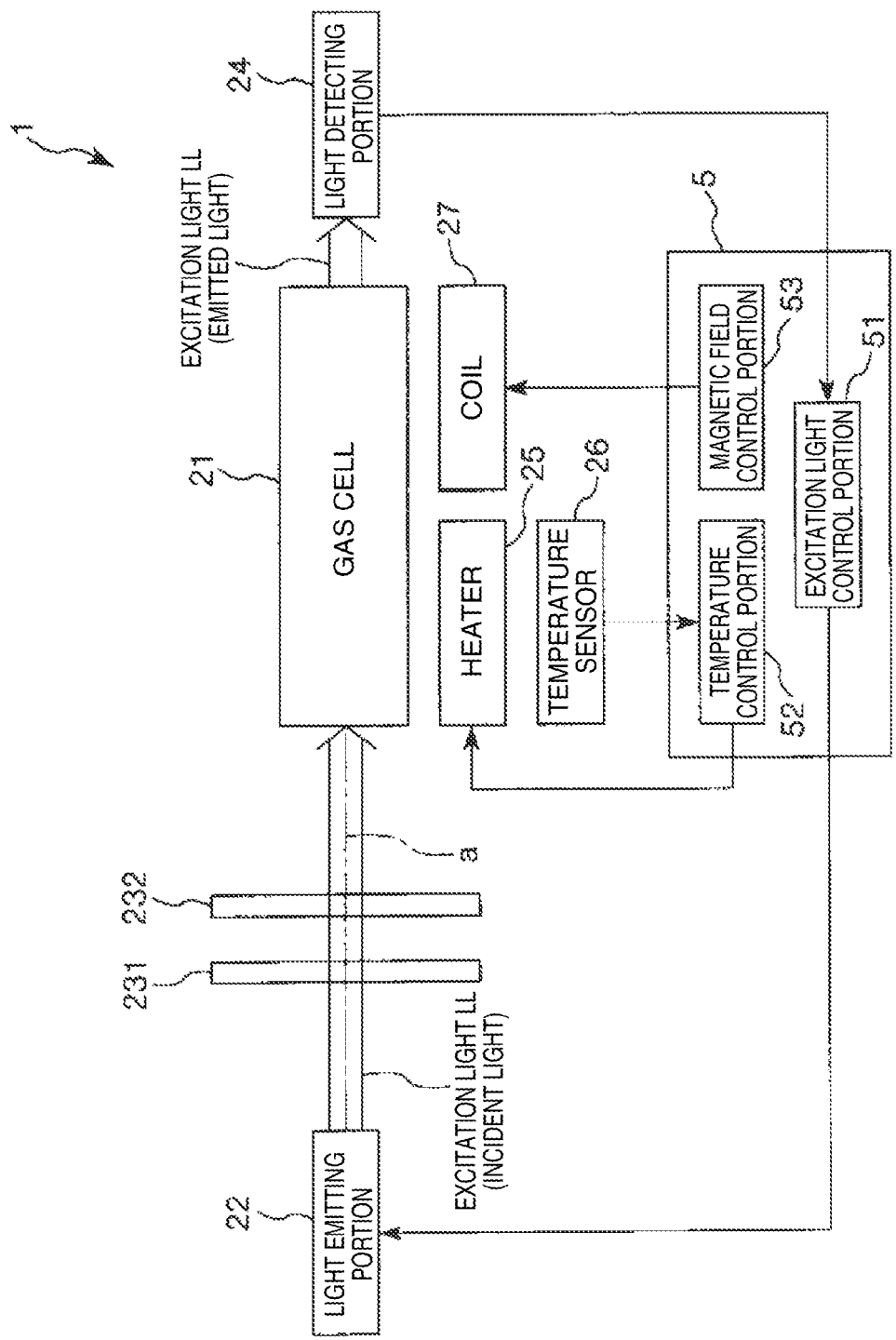
FIG. 2 is a schematic diagram of the atomic oscillator shown in FIG. 1.
Figure 3:
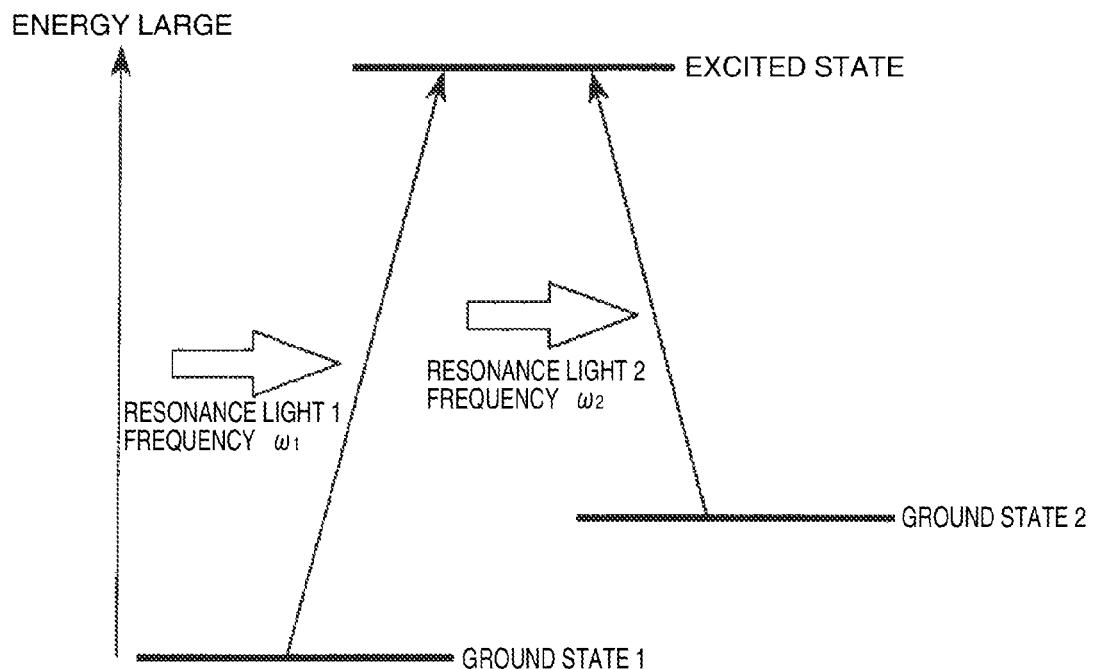
FIG. 3 is a diagram for explaining the energy state of alkali metal in a gas cell of the atomic oscillator shown in FIG. 1.
Figure 4:
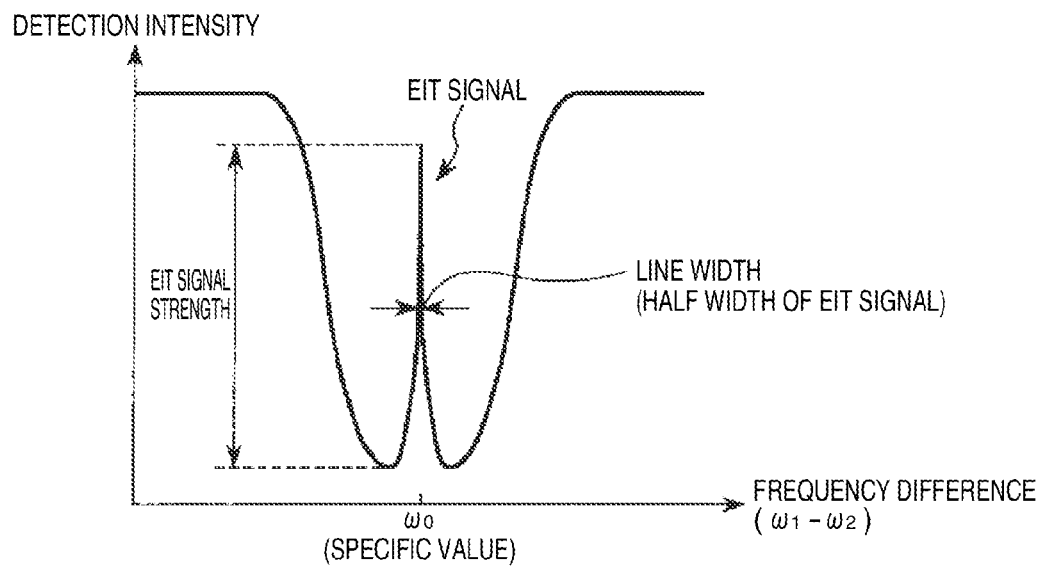
FIG. 4 is a graph showing the relationship between the frequency difference of two light components from a light emitting portion and the detection intensity in a light detecting portion for the light emitting portion and the light detecting portion of the atomic oscillator shown in FIG. 1.
Figure 5:
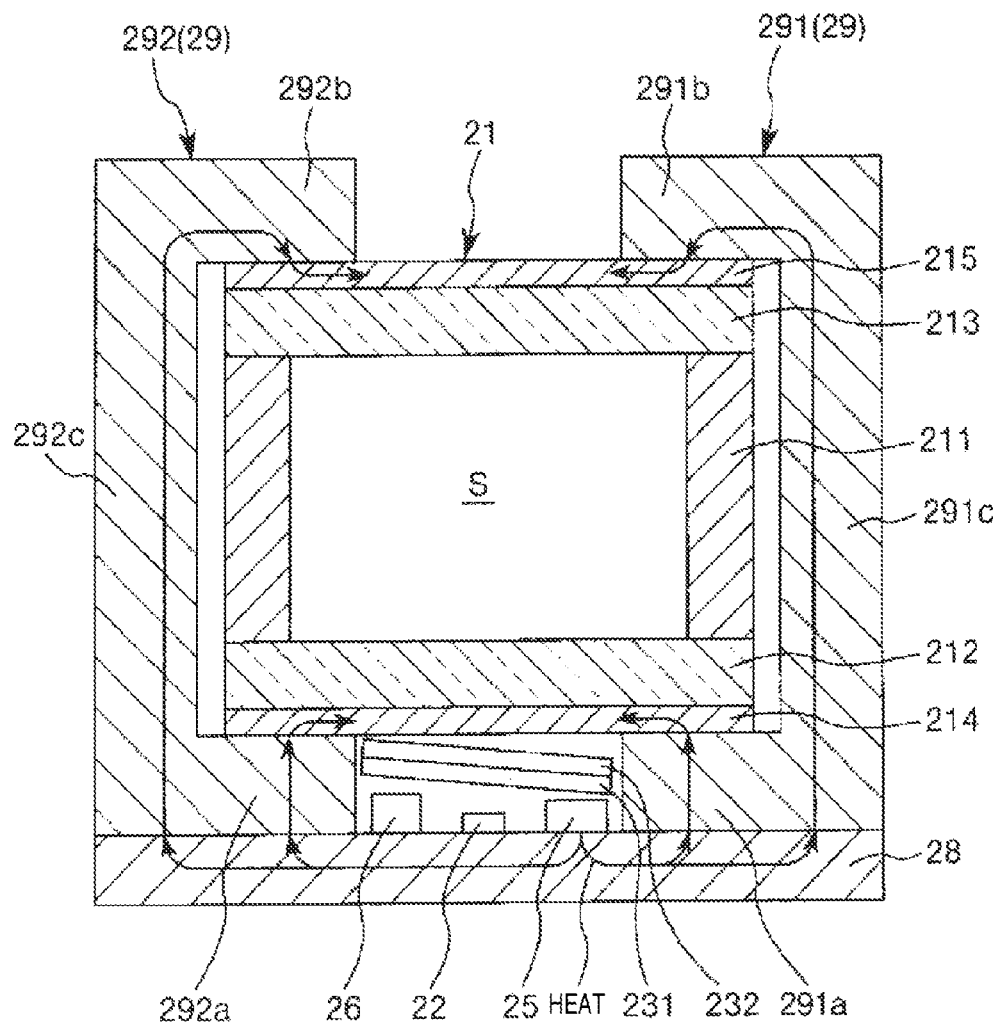
FIG. 5 is a cross-sectional view for explaining a heating portion and a connection member of the atomic oscillator shown in FIG. 1.
Figure 6:
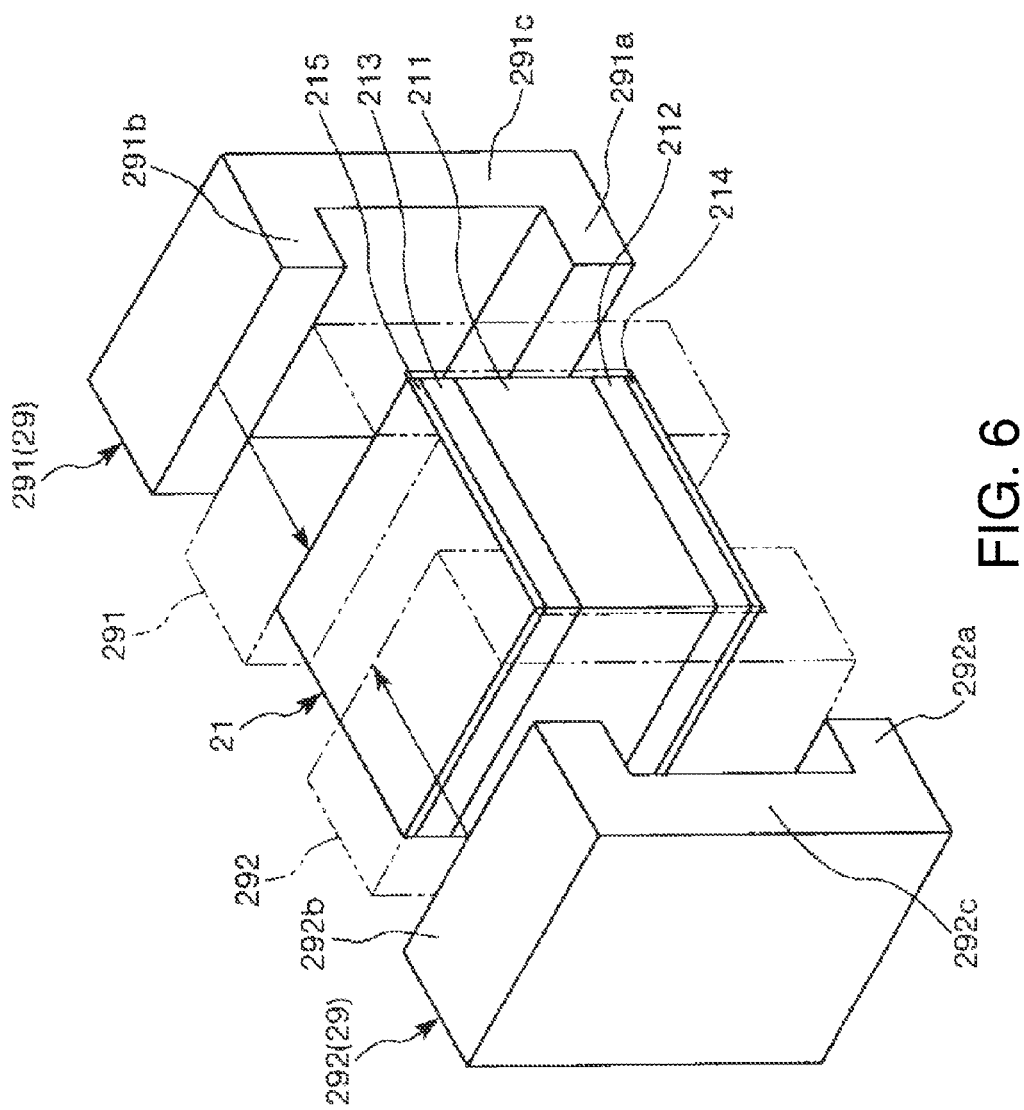
FIG. 6 is an exploded view for explaining the gas cell and the connection member of the atomic oscillator shown in FIG. 1.
Figure 7:
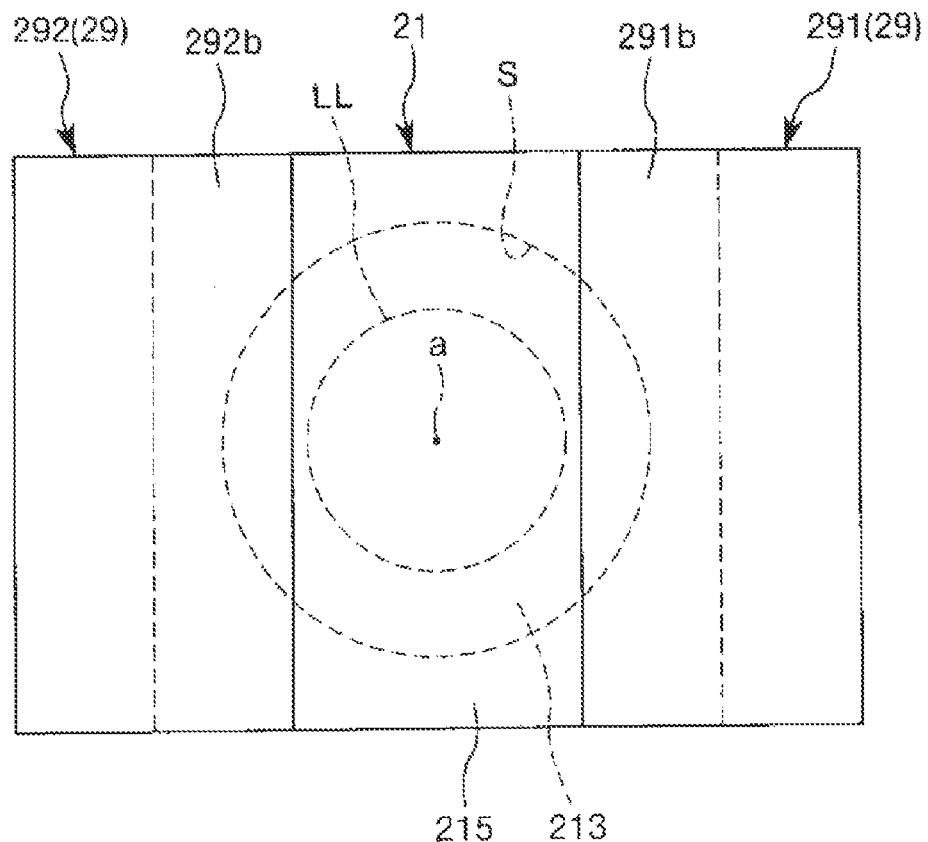
FIG. 7 is a plan view for explaining the gas cell and the connection member of the atomic oscillator shown in FIG. 1.
Figure 8A:
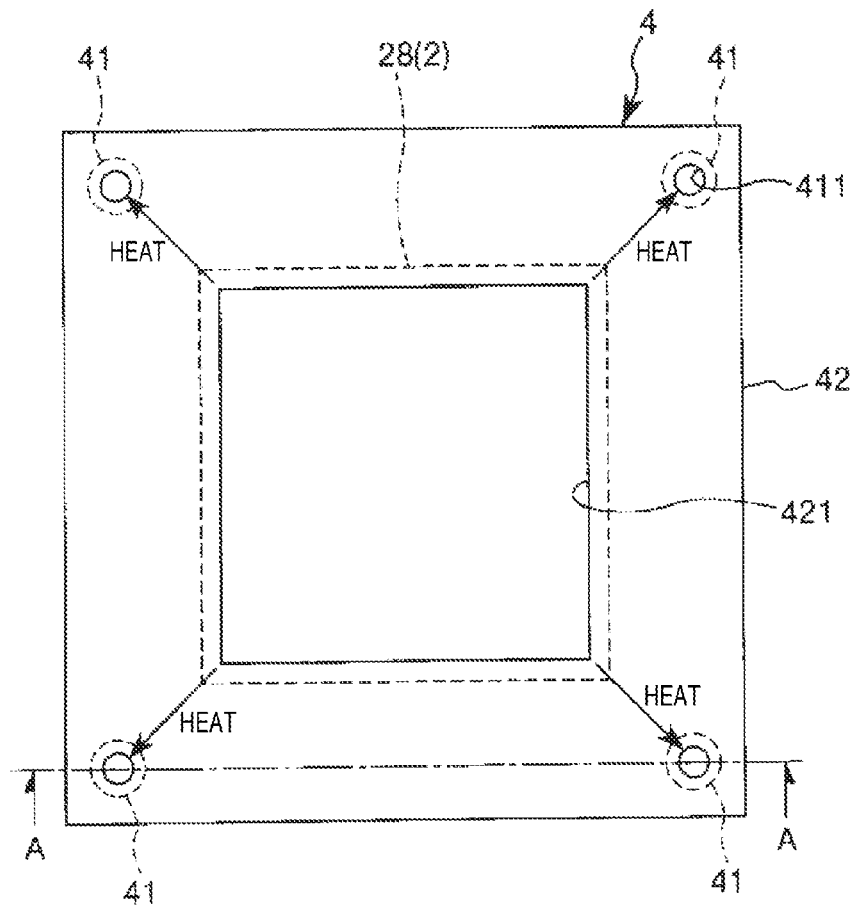
FIG. 8A is a plan view for explaining a support member of the atomic oscillator shown in FIG. 1.
Figure 8B:
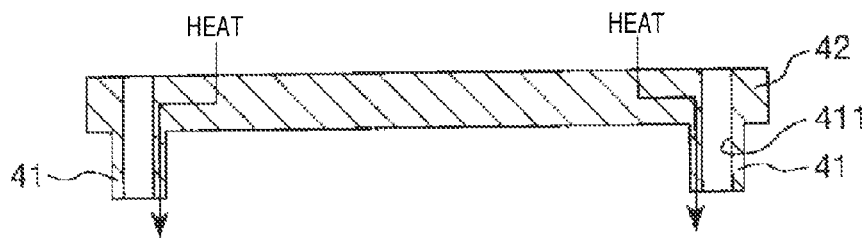
FIG. 8B is a cross-sectional view taken along the line A-A in FIG. 8A.

FIG. 1 is a cross-sectional view showing an atomic oscillator (quantum interference device) according to a first embodiment of the invention, and FIG. 2 is a schematic diagram of the atomic oscillator shown in FIG. 1. In addition, FIG. 3 is a diagram for explaining the energy state of alkali metal in a gas cell of the atomic oscillator shown in FIG. 1, and FIG. 4 is a graph showing the relationship between the frequency difference of two light components from a light emitting portion and the detection intensity in a light detecting portion for the light emitting portion and the light detecting portion of the atomic oscillator shown in FIG. 1. In addition, FIG. 5 is a cross-sectional view for explaining a heating portion and a connection member of the atomic oscillator shown in FIG. 1, FIG. 6 is an exploded view for explaining a gas cell and the connection member of the atomic oscillator shown in FIG. 1, and FIG. 7 is a plan view for explaining the gas cell and the connection member of the atomic oscillator shown in FIG. 1. In addition, FIG. 8A is a plan view for explaining a support member of the atomic oscillator shown in FIG. 1, and FIG. 8B is a cross-sectional view taken along the line A-A in FIG. 8A.

Hereinafter, for convenience of explanation, an upper side and a lower side in FIG. 1 are referred to as "top" and "bottom", respectively.

An atomic oscillator 1 shown in FIG. 1 is an atomic oscillator using a quantum interference effect.

As shown in FIG. 1, the atomic oscillator 1 includes a unit portion 2 that forms a main portion to cause a quantum interference effect, a package 3 in which the unit portion 2 is housed, and a support member 4 that is housed in the package 3 and supports the unit portion 2 against the package 3.

Here, the unit portion 2 includes a gas cell 21, a light emitting portion 22, optical components 231 and 232, a light detecting portion 24, a heater 25 (heating portion), a temperature sensor 26, a substrate 28, and a connection member 29, and these are unitized.

Moreover, although not shown in FIG. 1, the atomic oscillator 1 includes a coil 27 and a control portion 5 in addition to those described above (refer to FIG. 2).

First, the principle of the atomic oscillator 1 will be described briefly.

In the atomic oscillator 1, alkali metal (metal atoms), such as rubidium, cesium, and sodium in a gaseous state, is sealed in the gas cell 21.

As shown in FIG. 3, alkali metal has an energy level of the three level system, and can take three states of two ground states (ground states 1 and 2) of different energy levels and an excited state. Here, the ground state 1 is an energy state lower than the ground state 2.

When two types of resonance light components 1 and 2 having different frequencies are emitted to such gaseous alkali metal, the light absorption rate (light transmittance) in alkali metal of the resonance light components 1 and 2 changes depending on a difference ($\omega1-\omega2$) between the frequency $\omega1$ of the resonance light 1 and the frequency $\omega2$ of the resonance light 2.

In addition, when the difference ($\omega1-\omega2$) between the frequency $\omega1$ of the resonance light 1 and the frequency $\omega2$ of the resonance light 2 matches a frequency equivalent to the energy difference between the ground states 1 and 2, each excitation from the ground states 1 and 2 to the excited state is stopped. In this case, both the resonance light components 1 and 2 are transmitted through the alkali metal without being absorbed by the alkali metal. Such a phenomenon is called a CPT phenomenon or an electromagnetically induced transparency (EIT) phenomenon.

The light emitting portion 22 emits two types of light components (resonance light 1 and resonance light 2), which have different frequencies as described above, toward the gas cell 21.

For example, as the light emitting portion 22 changes the frequency $\omega2$ of the resonance light 2 in a state where the frequency $\omega1$ of the resonance light 1 is fixed, when the difference ($\omega1-\omega2$) between the frequency $\omega1$ of the resonance light 1 and the frequency $\omega2$ of the resonance light 2 matches a frequency $\omega0$ equivalent to the energy difference between the ground states 1 and 2, the detection intensity of the light detecting portion 24 rises steeply as shown in FIG. 4. Such a steep signal is detected as an EIT signal. The EIT signal has a unique value determined by the type of alkali metal. Accordingly, by using the EIT signal, it is possible to form an oscillator.

Hereinafter, each portion of the atomic oscillator 1 will be described in detail in a sequential manner.

Gas Cell

In the gas cell 21, alkali metal (metal atoms), such as rubidium, cesium, and sodium in a gaseous state, is sealed.

As shown in FIG. 5, the gas cell 21 includes a body portion 211 having a columnar through hole and a pair of window portions 212 and 213 that block both openings of the through hole. In this manner, internal space S where the alkali metal described above is sealed is formed.

Here, the body portion 211 forms a side wall that forms the internal space S together with the two window portions 212 and 213. In addition, each of the window portions 212 and 213 of the gas cell 21 allows excitation light from the light emitting portion 22 to be transmitted therethrough. In addition, excitation light incident on the gas cell 21 is transmitted through one window portion 212, and excitation light emitted from the gas cell 21 is transmitted through the other window portion 213.

A constituent material of the window portions 212 and 213 is not particularly limited as long as the material allows excitation light to be transmitted therethrough as described above. For example, a glass material, crystal, and the like can be mentioned.

In addition, a constituent material of the body portion 211 of the gas cell 21 is not particularly limited. For example, a metal material, a resin material, and the like may be used, or a glass material and crystal may be used similar to the window portions 212 and 213.

In addition, the window portions 212 and 213 are airtightly bonded to the body portion 211. Therefore, the internal space S of the gas cell 21 can be formed as airtight space.

A method of bonding the body portion 211 and the window portions 212 and 213 of the gas cell 21 is determined depending on their constituent materials. Although the method is not limited in particular, for example, a bonding method using an adhesive, a direct bonding method, an anodic bonding method, and the like can be used.

In addition, a heat transfer layer 214 is provided on the surface of the window portion 212 of the gas cell 21. Similarly, a heat transfer layer 215 is provided on the surface of the window portion 213 of the gas cell 21.

Each of the heat transfer layers 214 and 215 is formed of a material having a larger thermal conductivity than the constituent material that forms the window portions 212 and 213. Thus, since the heat transfer layers 214 and 215 contain a material, which has a larger thermal conductivity than a material that forms the window portions 212 and 213, on the surface of the window portions 212 and 213, heat from the connection member 29 can be efficiently diffused by thermal conduction due to the heat transfer layers 214 and 215. As a result, it is possible to make the temperature distribution of each of the window portions 212 and 213 uniform.

In the present embodiment, the heat transfer layers 214 and 215 are provided on the outer surface side of the gas cell 21. Therefore, the connection member 29 can be brought into contact with each of the heat transfer layers 214 and 215. Therefore, the transfer of heat from the connection member 29 to each of the heat transfer layers 214 and 215 can be efficiently performed. As a result, since it is possible to prevent the gaseous alkali metal from being condensed on the light passing surface of the gas cell 21, it is possible to improve the stability characteristics of the atomic oscillator 1.

In addition, the same heat transfer layer as the heat transfer layers 214 and 215 may also be provided on the inner surface of each of the window portions 212 and 213. In this case, it is possible to make the temperature distribution of each of the window portions 212 and 213 uniform more efficiently.

In addition, the heat transfer layers 214 and 215 allow excitation light to be transmitted therethrough. Accordingly, excitation light from the outside of the gas cell 21 can be made to be incident on the gas cell 21 through the heat transfer layer 214 and the window portion 212. In addition, excitation light from the inside of the gas cell 21 can be emitted to the outside of the gas cell 21 through the window portion 213 and the heat transfer layer 215.

A constituent material of the heat transfer layers 214 and 215 is not particularly limited as long as the material has a larger thermal conductivity than the constituent material of the window portions 212 and 213 and allows excitation light to be transmitted through the heat transfer layers 214 and 215. For example, diamond, diamond-like carbon (DLC), and the like can be used.

Light Emitting Portion

The light emitting portion 22 has a function of emitting excitation light to excite alkali metal atoms in the gas cell 21.

More specifically, the light emitting portion 22 emits two types of light components (resonance light 1 and resonance light 2) having different frequencies as described above.

The frequency ω1 of the resonance light 1 is for exciting the alkali metal in the gas cell 21 from the ground state 1 to the excited state described above.

In addition, the frequency ω2 of the resonance light 2 is for exciting the alkali metal in the gas cell 21 from the ground state 2 to the excited state described above.

As the light emitting portion 22, there is no particular limitation as long as the excitation light can be emitted as described above. For example, a semiconductor laser, such as a vertical cavity surface emitting laser (VCSEL), can be used.

Optical Component

As shown in FIG. 2, each of the plurality of optical components 231 and 232 is provided on the optical path of excitation light LL between the light emitting portion 22 and the gas cell 21.

In the present embodiment, the optical components 231 and 232 are disposed in this order from the light emitting portion 22 side to the gas cell 21 side.

The optical component 231 is a λ/4 wave plate. Accordingly, the excitation light LL from the light emitting portion 22 can be converted from linearly polarized light to circularly polarized light (right-handed circularly polarized light or left-handed circularly-polarized light).

As will be described later, if excitation light of linearly polarized light is emitted to alkali metal atoms in a state where the alkali metal atoms in the gas cell 21 are Zeeman splitting due to the magnetic field of the coil 27, the alkali metal atoms are present so as to be evenly dispersed in a plurality of Zeeman-split levels by interaction between the excitation light and the alkali metal atom. For this reason, since the number of alkali metal atoms in a desired energy level is reduced relative to the number of alkali metal atoms in another energy level, the number of atoms to cause a desired EIT phenomenon is reduced, and the strength of a desired EIT signal is reduced. As a result, the oscillation characteristics of the atomic oscillator 1 are degraded.

In contrast, as will be described later, if excitation light of circularly polarized light is emitted to alkali metal atoms in a state where the alkali metal atoms in the gas cell 21 are Zeeman splitting due to the magnetic field of the coil 27, the number of alkali metal atoms in a desired energy level of a plurality of levels of the alkali metal atoms Zeeman splitting can be increased relative to the number of alkali metal atoms in another energy level by interaction between the excitation light and the alkali metal atom. For this reason, the number of atoms to cause a desired EIT phenomenon is increased, and the strength of a desired EIT signal is increased. As a result, the oscillation characteristics of the atomic oscillator 1 are improved.

The optical component 232 is a dimming filter (ND filter). Therefore, the intensity of the excitation light LL incident on the gas cell 21 can be adjusted (reduced). For this reason, even if the output of the light emitting portion 22 is large, the amount of excitation light incident on the gas cell 21 can be set to the desired amount of light. In the present embodiment, the intensity of the excitation light LL having polarized light in a predetermined direction, which has passed through the optical component 231, is adjusted by the optical component 232.

In addition, between the light emitting portion 22 and the gas cell 21, not only the wave plate and the dimming filter but also other optical components, such as a lens and a polarizing plate, may be disposed. In addition, depending on the intensity of excitation light from the light emitting portion 22, the optical component 232 may be omitted.

Light Detecting Portion

The light detecting portion 24 has a function of detecting the intensity of the excitation light LL (resonance light components 1 and 2) transmitted through the gas cell 21.

In the present embodiment, the light detecting portion 24 is bonded to the connection member 29 with an adhesive 30 interposed therebetween.

Here, a known adhesive can be used as the adhesive 30. However, by using an adhesive with excellent thermal conductivity, it is also possible to adjust the temperature of the light detecting portion 24 by the heat from the connection member 29. On the other hand, when using an adhesive with excellent thermal insulation, it is possible to suppress heat interference between the connection member 29 and the light detecting portion 24.

As the light detecting portion 24, there is no particular limitation as long as the excitation light can be detected as described above. For example, an optical detector (light receiving element), such as a solar battery and a photodiode, can be used.

Heater

The heater 25 is a heating resistor (heating portion) that generates heat by current application.

Heat from the heater 25 is transferred to the gas cell 21 through the substrate 28 and the connection member 29. As a result, the gas cell 21 (more specifically, alkali metal in the gas cell 21) is heated, and the alkali metal in the gas cell 21 can be maintained in a gas state. In addition, in the present embodiment, heat from the heater 25 is also transferred to the light emitting portion 22 through the substrate 28.

The heater 25 is separated from the gas cell 21. Accordingly, it is possible to suppress a situation where the unnecessary magnetic field caused by the application of current to the heater 25 has an adverse effect on the metal atoms in the gas cell 21.

In the present embodiment, the heater 25 is provided on the substrate 28. In this case, heat from the heater 25 is transferred to the substrate 28.

In addition, in the present embodiment, the heater 25 is separated from a part of the connection member 29 so as to face each other. Accordingly, heat from the heater 25 can be efficiently transferred to the connection member 29, the gas cell 21, and the like. In addition, the heater 25 may face a part of the connection member 29, and may be connected to a part of the connection member 29.

In addition, it is also possible to use a Peltier element instead of the heater 25 or together with the heater 25. In this case, a heating side portion of the Peltier element forms a heating portion.

Temperature Sensor

The temperature sensor 26 detects the temperature of the heater 25 or the gas cell 21. In addition, the amount of heat generation of the heater 25 is controlled on the basis of the detection result of the temperature sensor 26. In this manner, it is possible to maintain alkali metal atoms in the gas cell 21 at a desired temperature.

In the present embodiment, the temperature sensor 26 is provided on the substrate 28.

In addition, the installation position of the temperature sensor 26 is not limited thereto. For example, the temperature sensor 26 may be provided on the connection member 29, or may be provided on the heater 25, or may be provided on the outer surface of the gas cell 21.

As the temperature sensor 26, various known temperature sensors, such as a thermistor and a thermocouple, can be used without being particularly limited.

Coil

The coil 27 has a function of generating a magnetic field by current application. Accordingly, by applying a magnetic field to the alkali metal in the gas cell 21, a gap between the degenerate different energy levels of the alkali metal is spread by Zeeman splitting, thereby being able to improve the resolution. As a result, it is possible to improve the accuracy of the oscillation frequency of the atomic oscillator 1.

In addition, the magnetic field generated by the coil 27 may be either a DC magnetic field or an AC magnetic field, or may be a magnetic field in which the DC magnetic field and the AC magnetic field are superimposed.

In addition, the coil 27 may be a solenoid coil provided so as to surround the gas cell 21, or may be a Helmholtz coil provided so as to interpose the gas cell 21.

Although the installation position of the coil 27 is not shown in the diagram, the coil 27 may be provided between the gas cell 21 and the connection member 29, or may be provided between the connection member 29 and the package 3.

Substrate

The light emitting portion 22, the heater 25, the temperature sensor 26, and the connection member 29 are mounted on one surface (top surface) of the substrate 28.

The substrate 28 has a function of transferring the heat from the heater 25 to the connection member 29. Accordingly, even if the heater 25 is separated from the connection member 29, the heat from the heater 25 can be transferred to the connection member 29.

Here, the substrate 28 thermally connects the heater 25 and the connection member 29 to each other. Thus, by mounting the heater 25 and the connection member 29 on the substrate 28, it is possible to increase the degree of freedom of installation of the heater 25.

In addition, since the light emitting portion 22 is mounted on the substrate 28, it is possible to adjust the temperature of the light emitting portion 22 by the heat from the heater 25.

In addition, the substrate 28 also has a function of supporting the light emitting portion 22, the heater 25, the temperature sensor 26, and the connection member 29.

A constituent material of the substrate 28 is not particularly limited, and a material with excellent thermal conductivity, for example, a metal material can be used. In addition, when the substrate 28 is formed of a metal material, an insulating layer formed of, for example, a resin material, a metal oxide, or a metal nitride may be provided on the surface of the substrate 28 as necessary.

In addition, the substrate 28 can be omitted depending on the shape of the connection member 29, the installation position of the heater 25, and the like. In this case, the heater 25 may be provided at a position where the heater 25 is brought into contact with the connection member 29.

Connection Member

The connection member 29 thermally connects the heater 25 and each of the window portions 212 and 213 of the gas cell 21. Accordingly, since the heat from the heater 25 is transferred to the window portions 212 and 213 by thermal conduction by the connection member 29, each of the window portions 212 and 213 can be heated. In addition, the heater 25 and the gas cell 21 can be separated from each other. In this case, it is possible to suppress a situation where the unnecessary magnetic field caused by the application of current to the heater 25 has an adverse effect on the metal atoms in the gas cell 21. In addition, since the number of heaters 25 can be reduced, the number of wiring lines for the application of current to the heater 25 can be reduced. As a result, it is possible to miniaturize the atomic oscillator 1 (quantum interference device).

As shown in FIG. 5, the connection member 29 is formed by a pair of connection members 291 and 292 provided with the gas cell 21 interposed therebetween. Accordingly, heat can be uniformly transferred from the connection member 29 to each of the window portions 212 and 213 of the gas cell 21 while simplifying the installation of the connection member 29 with respect to the gas cell 21.

More specifically, the connection member 291 includes a pair of connection portions 291a and 291b, which are disposed with the gas cell 21 interposed therebetween in a direction in which the two window portions 212 and 213 are aligned, and a connecting portion 291c that connects the pair of connection portions 291a and 291b to each other. Similarly, the connection member 292 includes a pair of connection portions 292a and 292b, which are disposed with the gas cell 21 interposed therebetween in a direction in which the two window portions 212 and 213 are aligned, and a connecting portion 292c that connects the pair of connection portions 292a and 292b to each other. Accordingly, heat from the heater 25 can be efficiently transferred to each of the window portions 212 and 213.

Here, each of the connection portions 291a and 292a is in contact with the heat transfer layer 214. Similarly, each of the connection portions 291b and 292b is in contact with the heat transfer layer 214.

That is, the window portion 212 and each of the connection members 291 and 292 are connected to each other through the heat transfer layer 214. Similarly, the window portion 213 and each of the connection members 291 and 292 are connected to each other through the heat transfer layer 215. Accordingly, heat from the connection members 291 and 292 can be efficiently transferred to the window portions 212 and 213.

In addition, each of the connection portions 291a, 291b, 292a, and 292b is formed so as to avoid the passage area of the excitation light LL. That is, each of the connection portions 291a, 291b, 292a, and 292b is disposed outside the passage area of the excitation light LL. Accordingly, it is possible to make excitation light incident on the gas cell 21 while emitting the excitation light from the gas cell 21.

In the present embodiment, when viewed from a direction parallel to the axis a of the excitation light LL, the connection portions 291a, 291b, 292a, and 292b are located outside the internal space S. Therefore, the passage area of the excitation light LL can be increased.

Such a pair of connection members 291 and 292 are fitted so as to interpose the gas cell 21 from both sides of a pair of side surfaces, which face each other, of the gas cell 21, for example, as shown in FIG. 6.

The connection members 291 and 292 before being fitted are designed such that the distance between the connection portions 291a and 291b in the connection member 291 and the distance between the connection portions 292a and 292b in the connection member 292 are equal to or slightly smaller than the distance between the outer surface of the heat transfer layer 214 and the outer surface of the heat transfer layer 215 in the gas cell 21 (distance between the outer surface of the window portion 212 and the outer surface of the window portion 213 when the heat transfer layers 214 and 215 are omitted). In addition, the connecting portions 291c and 292c are elastically deformed as necessary, so that the connection members 291 and 292 are fitted to the gas cell 21 as described above. In this manner, each of the connection portions 291a and 292a can be brought into contact with the heat transfer layer 214 (the window portion 212 when the heat transfer layers 214 and 215 are omitted), and each of the connection portions 291b and 292b can be brought into contact with the heat transfer layer 214 (the window portion 212 when the heat transfer layers 214 and 215 are omitted).

In addition, when a gap is formed at least either between the heat transfer layer 214 and the connection portions 291a and 292a or between the heat transfer layer 215 and the connection portions 291b and 292b, an adhesive with thermal conductivity may be filled in the gap. As examples of the adhesive, metal paste, a resin based adhesive containing a thermally conductive filler, and a silicone resin based adhesive can be mentioned. By using such an adhesive, it is possible to have excellent thermal conductivity between the heat transfer layer 214 and the connection portions 291a and 292a or between the heat transfer layer 215 and the connection portions 291b and 292b even if a gap is formed between the heat transfer layer 214 and the connection portions 291a and 292a or between the heat transfer layer 215 and the connection portions 291b and 292b. In addition, even if such a gap is not formed, the connection members 291 and 292 can be fixed to the gas cell 21 using the above-described adhesive. In addition, such an adhesive can also be filled between the connection members 291 and 292.

In addition, each of the connecting portions 291c and 292c is disposed such that a gap is formed between each of the connecting portions 291c and 292c and the gas cell 21. That is, each of the connection portions 291c and 292c has a portion separated from the gas cell 21. In this case, since the transfer of heat between each of the connecting portions 291c and 292c and the gas cell 21 can be suppressed, heat can be efficiently transferred from the connection members 291 and 292 to the window portions 212 and 213.

As a constituent material of the connection member 29, a material having a larger thermal conductivity than a material that forms the body portion 211 of the gas cell 21 may be used. For example, a metal material, which is a material with excellent thermal conductivity, can be used. In addition, for example, it is possible to use soft magnetic materials, such as Fe and various Fe alloys (silicon iron, permalloy, amorphous, Sendust). Accordingly, it is possible to suppress a situation where the unnecessary magnetic field caused by the application of current to the heater 25 has an adverse effect on the metal atoms in the gas cell 21. In addition, it is also possible to suppress the magnetization of an unnecessary magnetic field.

Package

The package 3 has a function of housing the unit portion 2 and the support member 4 therein. In addition, although not shown in FIG. 1, the coil 27 shown in FIG. 2 is also housed in the package 3. In addition, components other than the components described above may be housed in the package 3.

As shown in FIG. 1, the package 3 includes a plate-like base 31 (base portion) and a bottomed cylindrical lid 32, and the opening of the lid 32 is blocked by the base 31. Thus, a space where the unit portion 2 and the support member 4 are housed is formed.

The base 31 supports the unit portion 2 through the support member 4.

In addition, although not shown, a plurality of wiring lines and a plurality of terminals for the application of current from the outside of the package 3 to the internal unit portion 2 are provided in the base 31.

A constituent material of the base 31 is not particularly limited. For example, a resin material, a ceramic material, and the like can be used.

The lid 32 is bonded to the base 31.

A method of bonding the base 31 and the lid 32 to each other is not particularly limited. For example, brazing, seam welding, energy beam welding (laser welding, electron beam welding, and the like), and the like can be used.

In addition, a bonding member for bonding the base 31 and the lid 32 to each other may be interposed between the base 31 and the lid 32.

A constituent material of the lid 32 is not particularly limited. For example, a resin material, a ceramic material, a metal material, and the like can be used.

In addition, it is preferable that the base 31 and the lid 32 are airtightly bonded to each other. That is, it is preferable that the inside of the package 3 is airtight space. In this case, the inside of the package 3 can be changed to a decompressed state or an inert gas filled state. As a result, the characteristics of the atomic oscillator 1 can be improved.

In particular, it is preferable that the inside of the package 3 is in a decompressed state.

In this case, it is possible to suppress the transfer of heat through the space in the package 3. Therefore, it is possible to suppress the thermal interference between the heater 25 and the gas cell 21 through the space in the package 3 or between the connection member 29 and the outside of the package 3. As a result, since the heat from the heater 25 is efficiently transferred to the window portions 212 and 213 through the connection member 29, it is possible to reduce the temperature difference between the two window portions 212 and 213.

In addition, the transfer of heat between the unit portion 2 and the outside of the package 3 can be suppressed more effectively.

Support Member 4

The support member 4 is housed in the package 3, and has a function of supporting the unit portion 2 against the base 31 that forms a part of the package 3.

In addition, the support member 4 has a function of suppressing the transfer of heat between the unit portion 2 and the outside of the package 3.

As shown in FIGS. 8A and 8B, the support member 4 includes a plurality of leg portions 41 (column portions) and a connecting portion 42 that connects the plurality of leg portions 41 to each other.

Each of the plurality of leg portions 41 is bonded to the inner surface of the base 31 in the package 3 by an adhesive, for example.

The plurality of leg portions 41 are disposed outside the unit portion 2 in plan view from a direction in which the base 31 and the unit portion 2 overlap each other (hereinafter, also simply referred to as "in plan view").

In the present embodiment, four leg portions 41 are provided so as to correspond to the corners of the gas cell 21 that forms a square in plan view.

Each leg portion 41 has a cylindrical shape, and is erected so as to extend in a direction perpendicular to the inner surface of the base 31.

In addition, a hollow portion 411 is formed in each leg portion 41. Therefore, it is possible to suppress the transfer of heat in each leg portion 41 while ensuring the rigidity of each leg portion 41.

It is preferable that the hollow portion 411 is in an atmosphere decompressed from the atmospheric pressure (decompressed state or vacuum state). In this case, it is possible to suppress the transfer of heat in each leg portion 41 more effectively.

In the present embodiment, the hollow portion 411 extends up and down through the leg portion 41. Therefore, by changing the inside of the package 3 to a decompressed state, the inside of the hollow portion 411 can also be changed to the decompressed state.

In addition, when the upper side of the hollow portion 411 is not open, if a gap for making the inside and outside of the hollow portion 411 communicate with each other is formed between each leg portion 41 and the base 31, the inside of the hollow portion 411 can also be changed to the decompressed state by changing the inside of the package 3 to the decompressed state.

The connection portion 42 connects the upper ends (one ends) of the plurality of leg portions 41. As a result, it is possible to increase the rigidity of the support member 4. In the present embodiment, the connecting portion 42 is formed integrally with the plurality of leg portions 41. In addition, the connecting portion 42 may be formed separately from the plurality of leg portions 41 and be bonded to each leg portion 41 by an adhesive, for example.

The entire connecting portion 42 has a plate shape. In this manner, it is possible to increase the rigidity of the support member 4 with a relatively simple structure.

In addition, the connecting portion 42 has a rectangular shape so that the four leg portions 41 are located in the corners in plan view.

The unit portion 2 (more specifically, the substrate 28) is bonded (connected) to the top surface (surface on the opposite side to the leg portion 41) of the connecting portion 42. As a result, the unit portion 2 is supported by the support member 4.

A connection portion between the connecting portion 42 and the unit portion 2 is located on the inner side than the upper ends (one ends) of the plurality of leg portions 41 in plan view.

A recess 421 is formed in a central portion of the top surface (that is, a surface on the side of the unit portion 2) of the connecting portion 42.

Space in the recess 421 is located between the unit portion 2 and the connecting portion 42. In this case, since the contact area of the unit portion 2 and the connecting portion 42 is reduced, it is possible to suppress the transfer of heat between the connecting portion 42 and the unit portion 2 effectively. In addition, it is also possible to suppress the transfer of heat in the connecting portion 42.

In the present embodiment, the recess 421 is disposed on the inner side than the outer portion of the unit portion 2 in plan view. Accordingly, the unit portion 2 is bonded to a portion of the connecting portion 42 on the outer peripheral side than the recess 421. In addition, the recess 421 may have a portion located outside the outer portion of the unit portion 2 in plan view.

In addition, it is preferable that the inside of the recess 421 is in a decompressed state. In this case, since the thermal insulation in the recess 421 is improved, it is possible to suppress the escape of heat from the unit portion 2 to the connecting portion 42.

Although the connection portion between the unit portion 2 and the support member 4 may be formed on the entire circumference along the outer periphery of the recess 421, it is preferable to form a plurality of connection portions in a spot shape from the point of view that thermal conduction between the unit portion 2 and the support member 4 through the connection portion is suppressed.

In addition, it is preferable that a gap for making the inside and outside of the recess 421 communicate with each other be formed between the unit portion 2 and the support member 4. Therefore, by changing the inside of the package 3 to a decompressed state, the inside of the recess 421 can also be changed to the decompressed state.

According to the support member 4, the lower end (other end) of each leg portion 41 is separated from the unit portion 2 in plan view. Therefore, the support member 4 has a portion in which the heat transfer path (hereinafter, referred to as a "heat transfer path of the support member 4") from a connection portion between the unit portion 2 and the support member 4 to the lower end of each leg portion 41 is bent or curved.

In this case, even if the distance between the base 31 and the unit portion 2 is reduced, it is possible to increase the heat transfer path from the unit portion 2 to the base 31 through the support member 4. As a result, it is possible to suppress the transfer of heat from the unit portion 2 to the base 31 through the support member 4 while miniaturizing the atomic oscillator 1. In addition, since a plurality of leg portions 41 are connected to each other by the connecting portion 42, it is possible to increase the rigidity of the support member 4. Therefore, it is possible to suppress the vibration of the unit portion 2.

In addition, assuming that the length of the heat transfer path of the support member 4 is L [m], the sum of the average cross-sectional area of the support member 4 in the heat transfer path is A [m$^2$], and the thermal conductivity of a material that forms the support member 4 is λ[W/(m·K)], it is preferable that the relationship of (thermal resistance)=(1/λ)× (L/A)≥16800[°C./W] is satisfied.

In this case, it is possible to suppress the transfer of heat from the unit portion 2 to the base 31 through the support member 4. In addition, since the power consumption of the heater 25 is reduced to 15 mW or less, it is possible to reduce the power consumption of the atomic oscillator 1. In addition, since the heater 25 can be made small, it is possible to miniaturize the atomic oscillator 1. Therefore, the atomic oscillator 1 can be mounted in various apparatuses.

In addition, a constituent material of the support member 4 is not particularly limited as long as the material has relatively low thermal conductivity and makes it possible for the support member 4 to have rigidity for supporting the unit portion 2. For example, it is preferable to use non-metal materials, such as a resin material and a ceramic material. More preferably, a resin material is used. When the support member 4 is formed of a resin material, even if the shape of the support member 4 is complicated, the support member 4 can be easily manufactured using a known method, such as an injection molding method. In addition, the constituent material of the leg portion 41 and the constituent material of the connecting portion 42 may be the same or may be different.

A resin material that forms the support member 4 is not particularly limited. For example, polyethylene, polyolefin such as ethylene-vinyl acetate copolymer (EVA), an acryl-based resin, acrylonitrile-butadiene-styrene copolymer (ABS resin), acrylonitrile-styrene copolymer (AS resin), polyethylene terephthalate (PET), polyether, polyether ketone (PEK), polyether ether ketone (PEEK), various kinds of thermoplastic elastomers including a styrene-based elastomer, a polyolefin-based elastomer, a polyvinyl chloride-based elastomer, a polyurethane-based elastomer, a polyester-based elastomer, a polyamide-based elastomer, a polybutadiene-based elastomer, a trans-polyisoprene-based elastomer, a fluororubber-based elastomer, and a chlorinated polyethylene-based elastomer, an epoxy resin, a phenol resin, an urea resin, a melamine resin, unsaturated polyester, a silicone resin, polyurethane, and copolymers, blends, and polymer alloys, which are mainly composed of the above materials, can be mentioned. In addition, one or two or more of these can be used in combination (for example, as a laminate of two or more layers).

In addition, it is preferable that the thermal conductivity of the support member 4 is equal to or greater than 0.1 W·m$^{-1}$·K$^1$ and equal to or less than 40 W·m$^{-1}$·K$^{-1}$. More preferably, the thermal conductivity of the support member 4 is equal to or greater than 0.1 W·m$^{-1}$·K$^{-1}$ and equal to or less than 0.5 W·m$^{-1}$·K$^{-1}$. Thus, thermal conduction between the unit portion 2 and the package 3 through the support member 4 can be suppressed more effectively. That is, it is possible to make the effect of thermally separating the unit portion 2 from the package 3 noticeable by improving the thermal insulation of the support member 4.

In addition, it is preferable that processing for increasing the reflectance of heat is performed on the surface of at least one of the leg portion 41 and the connecting portion 42. In this case, it is possible to suppress the transfer of heat due to radiation between the support member 4 and other members (in particular, the base 31).

Such processing for increasing the reflectance of heat is not particularly limited. For example, processing for forming a metal film on the surface of the support member 4 can be mentioned.

Control Portion

The control portion 5 shown in FIG. 2 has a function of controlling the heater 25, the coil 27, and the light emitting portion 22.

Such a control portion 5 includes an excitation light control portion 51 that controls the frequencies of the resonance light components 1 and 2 of the light emitting portion 22, a temperature control portion 52 that controls the temperature of the alkali metal in the gas cell 21, and a magnetic field control portion 53 that controls a magnetic field applied to the gas cell 21.

The excitation light control portion 51 controls the frequencies of the resonance light components 1 and 2 emitted from the light emitting portion 22 on the basis of a detection result of the light detecting portion 24 described above. More specifically, the excitation light control portion 51 controls the frequencies of the resonance light components 1 and 2 emitted from the light emitting portion 22 such that (ω1−ω2) detected by the light detecting portion 24 becomes the above-described frequency ω0 unique to the alkali metal. In addition, the excitation light control portion 51 controls the center frequency of the resonance light components 1 and 2 emitted from the light emitting portion 22. Thus, it is possible to detect the EIT signal described above. In addition, the control portion 5 causes a signal of a crystal oscillator (not shown) to be output in synchronization with the EIT signal.

In addition, the temperature control portion 52 controls the application of current to the heater 25 on the basis of the detection result of the temperature sensor 26. Thus, the gas cell 21 can be maintained in a desired temperature range.

In addition, the magnetic field control portion 53 controls the application of current to the coil 27 such that the magnetic field generated by the coil 27 is constant.

The control portion 5 is provided, for example, in an IC chip mounted on a substrate on which the package 3 is mounted. In addition, the control portion 5 may also be provided in the package 3.

According to the atomic oscillator 1 of the present embodiment described above, since the heater 25 is thermally connected to each of the two window portions 212 and 213 of the gas cell 21 through the connection member 29, heat from the heater 25 can be transmitted to each of the window portions 212 and 213 by thermal conduction using the connection member 29 and each of the window portions 212 and 213 can be heated. In addition, the heater 25 and the gas cell 21 can be separated from each other. In this case, it is possible to suppress a situation where the unnecessary magnetic field caused by the application of current to the heater 25 has an adverse effect on the metal atoms in the gas cell 21. In addition, since the number of heaters 25 can be reduced, the number of wiring lines for the application of current to the heater 25 can be reduced. As a result, it is possible to miniaturize the atomic oscillator 1.

Second Embodiment

Next, a second embodiment of the invention will be described.

Figure 9:
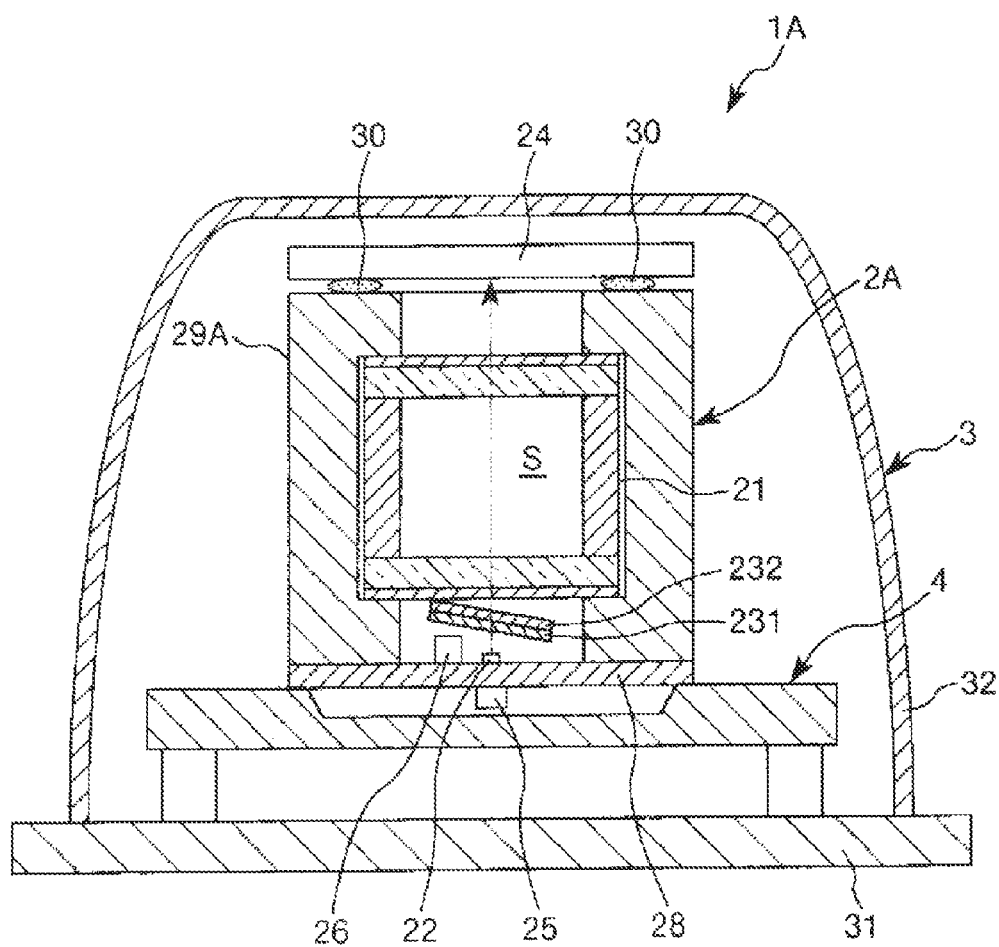
FIG. 9 is a cross-sectional view showing an atomic oscillator (quantum interference device) according to a second embodiment of the invention.
Figure 10:
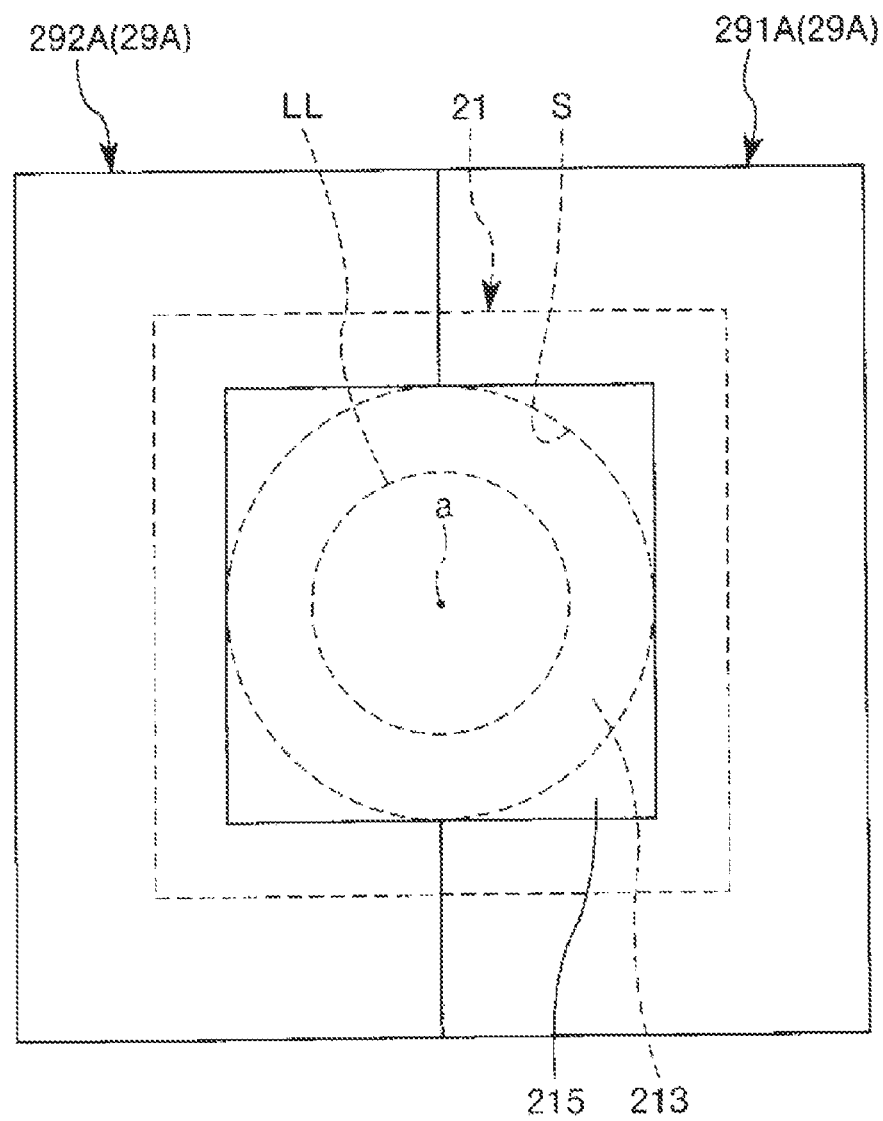
FIG. 10 is a plan view for explaining a gas cell and a connection member of the atomic oscillator shown in FIG. 9.

FIG. 9 is a cross-sectional view showing an atomic oscillator (quantum interference device) according to the second embodiment of the invention, and FIG. 10 is a plan view for explaining a gas cell and a connection member of the atomic oscillator shown in FIG. 9.

The atomic oscillator according to the present embodiment is the same as the atomic oscillator according to the first embodiment described above except that the configuration of the connection member and the arrangement of the light emitting portion are different.

Hereinafter, the atomic oscillator of the second embodiment will be described focusing on the differences from the first embodiment, and explanations on the same matters will be omitted. In addition, in FIGS. 9 and 10, the same reference numerals are given to the same components as in the embodiment described above.

An atomic oscillator 1A shown in FIG. 9 includes a unit portion 2A that forms a main portion to cause a quantum interference effect, a package 3 in which the unit portion 2A is housed, and a support member 4 that is housed in the package 3 and supports the unit portion 2A against the package 3.

Here, the unit portion 2A includes a gas cell 21, a light emitting portion 22, optical components 231 and 232, a light detecting portion 24, a heater 25 (heating portion), a temperature sensor 26, a substrate 28, and a connection member 29A, and these are unitized.

As shown in FIG. 10, the connection member 29A is configured to include a pair of connection members 291A and 292A provided with the gas cell 21 interposed therebetween.

The pair of connection members 291A and 292A is configured so as to surround the entire circumference of one window portion 213 of the gas cell 21. In addition, although not shown, the pair of connection members 291A and 292A is configured so as to surround the entire circumference of the other window portion of the gas cell 21. Therefore, it is possible to make the temperature distribution of each window of the gas cell 21 uniform more effectively.

In addition, although not shown, the pair of connection members 291A and 292A is configured so as to surround the entire circumference of a body portion (not shown) of the gas cell 21.

In the present embodiment, a region surrounded by the pair of connection member 291A and 292A in plan view has a rectangular shape (more specifically, a square shape) corresponding to the shape of the gas cell 21. In addition, the shape of the region is not limited to the rectangular shape, and may be a circular shape, for example.

As shown in FIG. 9, the heater 25 (heating portion) is provided on the substrate 28 on the opposite side to the gas cell 21. In this case, when viewed from the emission direction of excitation light of the light emitting portion 22, that is, in plan view, the heater 25 can be disposed at a position overlapping the region of the gas cell 21 through which excitation light passes. Therefore, the heat transfer path from the heater 25 to the region of the gas cell 21 through which excitation light passes can be made to be equal in each portion in the circumferential direction of each window portion of the gas cell 21.

In addition, in the present embodiment, it is preferable that the substrate 28 has a magnetic shielding property. Accordingly, it is possible to suppress a situation where the unnecessary magnetic field caused by the application of current to the heater 25 has an adverse effect on the metal atoms in the gas cell 21. In this case, as examples of the constituent material of the substrate 28, soft magnetic materials, such as Fe and various Fe alloys (silicon iron, permalloy, amorphous, Sendust), may be used.

Here, the substrate 28 may be formed integrally with the connection member 29A, or may form a part of the connection member 29A. Accordingly, the connection member 29A contains a soft magnetic material, and at least a part (substrate 28) is disposed between the gas cell 21 and the heater 25. As a result, it is possible to prevent a magnetic field from the heater 25 from reaching the gas cell 21.

According to the atomic oscillator 1A of the second embodiment described above, it is also possible to realize miniaturization while suppressing the influence of an unnecessary magnetic field from the heater 25, which generates heat by current application, on the gas cell 21.

2. Electronic Apparatus

The atomic oscillator according to the invention described above can be assembled into various kinds of electronic apparatuses. Such an electronic apparatus including the atomic oscillator according to the invention has excellent reliability.

Hereinafter, an example of the electronic apparatus including the atomic oscillator according to the invention will be described.

Figure 11:
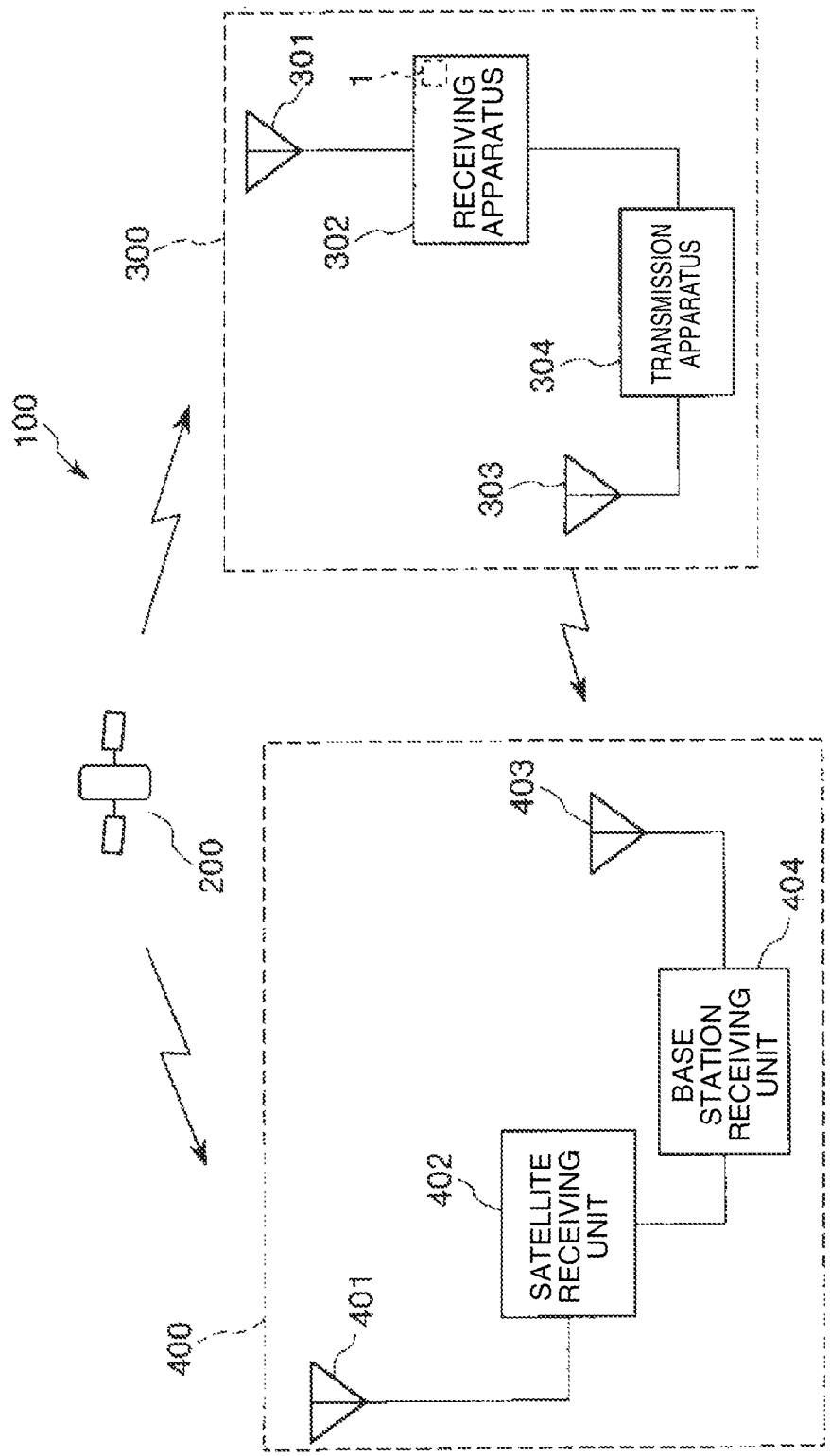
FIG. 11 is a diagram showing the schematic configuration when the atomic oscillator according to the embodiment of the invention is used in a positioning system using a GPS Satellite.

FIG. 11 is a diagram showing the schematic configuration when the atomic oscillator according to the invention is used in a positioning system using a GPS Satellite.

A positioning system 100 shown in FIG. 11 is configured to include a GPS satellite 200, a base station apparatus 300, and a GPS receiver 400.

The GPS satellite 200 transmits positioning information (GPS signal).

The base station apparatus 300 includes a receiving apparatus 302 that receives positioning information from the GPS satellite 200 with high accuracy through an antenna 301 disposed in the electronic reference point (GPS continuous observation station), for example, and a transmission apparatus 304 that transmits the positioning information received by the receiving apparatus 302 through an antenna 303.

Here, the receiving apparatus 302 is an electronic apparatus including the above-described atomic oscillator 1 according to the invention as a reference frequency oscillation source. Such a receiving apparatus 302 has excellent reliability. In addition, the positioning information received by the receiving apparatus 302 is transmitted by the transmission apparatus 304 in real time.

The GPS receiver 400 includes a satellite receiving unit 402 that receives the positioning information from the GPS satellite 200 through an antenna 401 and a base station receiving unit 404 that receives the positioning information from the base station apparatus 300 through an antenna 403.

Figure 12:
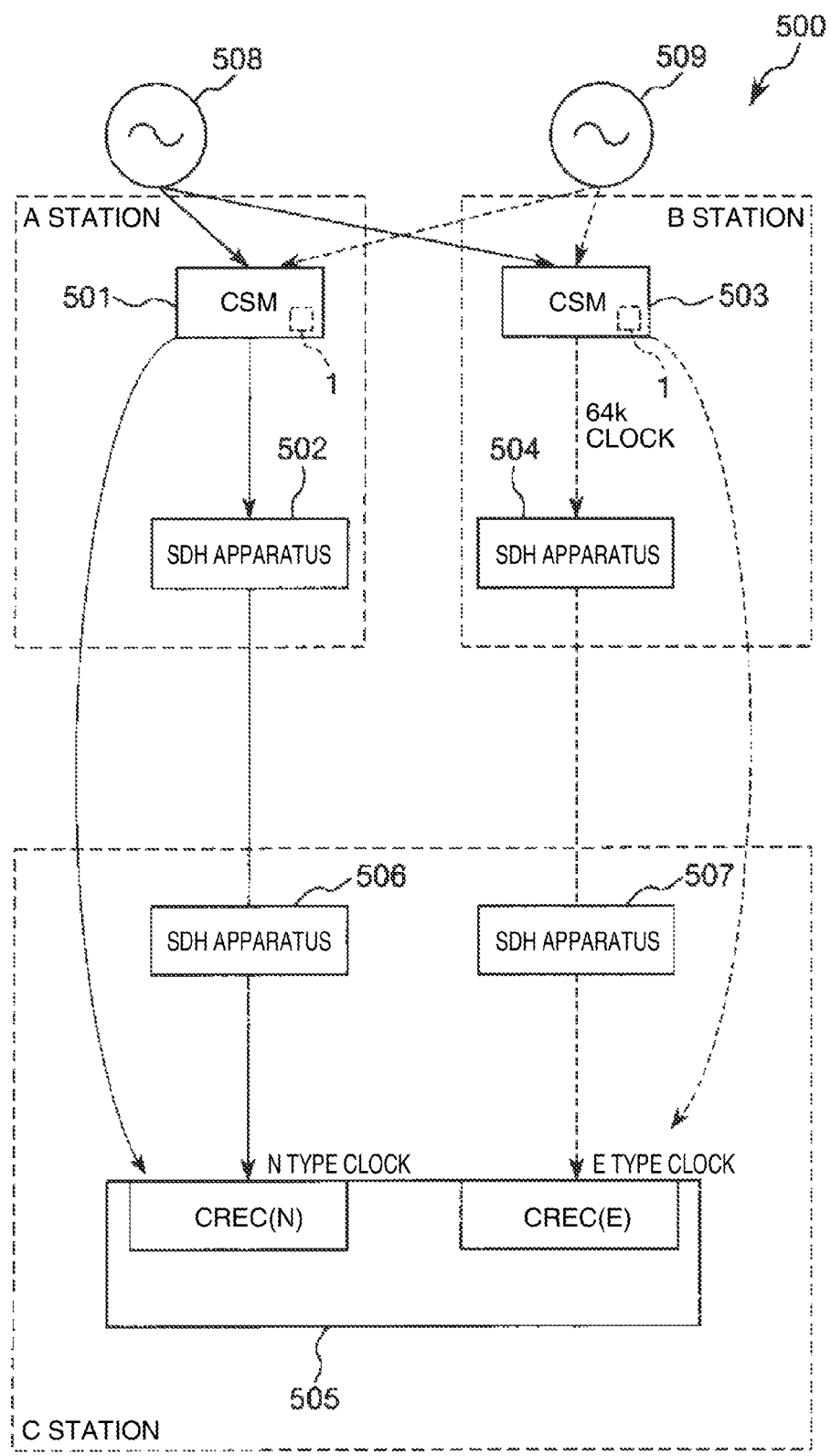
FIG. 12 is a schematic block diagram showing an example of a clock transmission system using the atomic oscillator according to the embodiment of the invention.

FIG. 12 is a schematic diagram showing an example of a clock transmission system using the atomic oscillator according to the invention.

A clock transmission system 500 shown in FIG. 12 is for matching the clock of apparatuses in a network of time-division multiplexing, and is a system having a redundant configuration of the N (Normal) type and the E (Emergency) type.

The clock transmission system 500 includes a clock supply module (CSM) 501 and a synchronous digital hierarchy (SDH) apparatus 502 of the A station (high order (N type)), a clock supply module 503 and an SDH apparatus 504 of the B station (high order (E type)), and a clock supply module 505 and SDH apparatuses 506 and 507 of the C station (low order).

The clock supply module 501 includes the atomic oscillator 1, and generates an N type clock signal. The atomic oscillator 1 in the clock supply module 501 generates a clock signal in synchronization with highly precise clock signals from the master clocks 508 and 509 including an atomic oscillator that uses cesium.

The SDH apparatus 502 transmits and receives a main signal on the basis of the clock signal from the clock supply module 501, and superimposes the N type clock signal on the main signal and transmits the resulting signal to the low-order clock supply module 505.

The clock supply module 503 includes the atomic oscillator 1, and generates an E type clock signal. The atomic oscillator 1 in the clock supply module 503 generates a clock signal in synchronization with highly precise clock signals from the master clocks 508 and 509 including an atomic oscillator that uses cesium.

The SDH apparatus 504 transmits and receives a main signal on the basis of the clock signal from the clock supply module 503, and superimposes the E type clock signal on the main signal and transmits the resulting signal to the low-order clock supply module 505.

The clock supply module 505 receives the clock signals from the clock supply modules 501 and 503, and generates a clock signal in synchronization with the received clock signals.

Here, the clock supply module 505 usually generates a clock signal in synchronization with the N type clock signal from the clock supply module 501. In addition, when there is a problem in the N type, the clock supply module 505 generates a clock signal in synchronization with the E type clock signal from the clock supply module 503. By switching the clock signal from N type to E type as described above, it is possible to ensure the stable clock supply. As a result, it is possible to increase the reliability of the clock path network.

The SDH apparatus 506 transmits and receives a main signal on the basis of the clock signal from the clock supply module 505. Similarly, the SDH apparatus 507 transmits and receives a main signal on the basis of the clock signal from the clock supply module 505. In this manner, the apparatus of the C station can be made to synchronize with the apparatus of the A station or the B station.

3. Moving Object

In addition, the atomic oscillator according to the invention described above can be assembled into various kinds of moving objects. Such a moving object including the atomic oscillator according to the invention has excellent reliability.

Hereinafter, an example of the moving object of the invention will be described.

Figure 13:
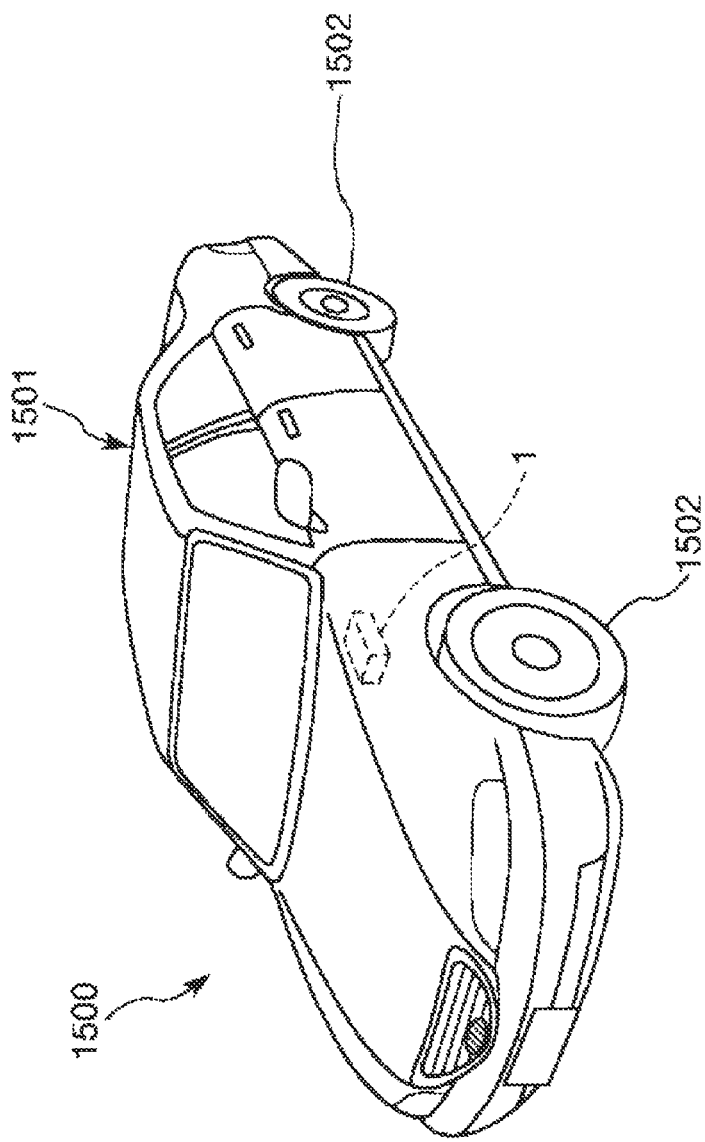
FIG. 13 is a perspective view showing the configuration of a moving object (vehicle) including the atomic oscillator according to the embodiment of the invention.

FIG. 13 is a perspective view showing the configuration of a moving object (vehicle) including the atomic oscillator according to the invention.

A moving object 1500 shown in FIG. 13 includes a vehicle body 1501 and four wheels 1502, and is configured to rotate the wheels 1502 using a power source (engine; not shown) provided in the vehicle body 1501. The atomic oscillator 1 is built in the moving object 1500. In addition, on the basis of an oscillation signal from the atomic oscillator 1, for example, a control unit (not shown) controls the driving of the power source.

In addition, electronic apparatuses or moving objects including the atomic oscillator according to the invention are not limited to those described above. For example, the atomic oscillator according to the invention can also be applied to a mobile phone, a digital still camera, an ink jet type discharge apparatus (for example, an ink jet printer), a personal computer (a mobile personal computer and a laptop personal computer), a television, a video camera, a video tape recorder, a car navigation apparatus, a pager, an electronic diary (electronic diary with a communication function is also included), an electronic dictionary, an electronic calculator, an electronic game machine, a word processor, a workstation, a video phone, a television monitor for security, electronic binoculars, a POS terminal, medical equipment (for example, an electronic thermometer, a sphygmomanometer, a blood sugar meter, an electrocardiographic measurement device, an ultrasonic diagnostic apparatus, and an electronic endoscope), a fish detector, various measurement apparatuses, instruments (for example, instruments for vehicles, aircraft, and ships), and a flight simulator.

While the quantum interference device, the atomic oscillator, and the moving object according to the invention have been described with reference to the illustrated embodiments, the invention is not limited to these. For example, the configuration of each portion of the embodiments described above may be replaced with an arbitrary configuration having the same function, and an arbitrary configuration may be added.

In addition, in the invention, arbitrary configurations of the embodiments described above may be combined.

The entire disclosure of Japanese Patent Application No. 2013-029167, filed Feb. 18, 2013 is expressly incorporated by reference herein.

What is claimed is:

1. A quantum interference device, comprising:
a gas cell including two window portions having a light transmissive property and a side wall that seals metal atoms together with the two window portions;
a light emitting portion that emits light that is transmitted through one of the window portions to excite the metal atoms;
a light detecting portion that detects the light passing through the metal atoms and transmitted through the other window portion;
a heating portion that generates heat; and
a connection member that contains a material having a larger thermal conductivity than a material forming the side wall and that thermally connects the heating portion and each of the two window portions to each other.

2. A quantum interference device, comprising:
a gas cell including two window portions having a light transmissive property and a side wall that seals metal atoms together with the two window portions;
a light emitting portion that emits light that is transmitted through one of the window portions to excite the metal atoms;
a light detecting portion that detects the light passing through the metal atoms and transmitted through the other window portion;
a heating portion that generates heat; and
a connection member that contains a material having a larger thermal conductivity than a material forming the side wall and is connected to the two window portions, a part of the connection member facing the heating portion.

3. The quantum interference device according to claim 1, wherein a heat transfer layer, which contains a material having a larger thermal conductivity than a material that forms each of the window portions, is disposed on a surface of each of the window portions.

4. The quantum interference device according to claim 3, wherein each of the window portions and the connection member are connected to each other through the heat transfer layer.

5. The quantum interference device according to claim 1, wherein the connection member has a pair of connection portions, which are provided with the gas cell interposed therebetween in a direction in which the two window portions are aligned, and a connecting portion that connects the pair of connection portions to each other.

6. The quantum interference device according to claim 5, wherein the connecting portion has a portion separated from the gas cell.

7. The quantum interference device according to claim 1, wherein the connection member contains a soft magnetic material, and at least a part of the connection member is disposed between the gas cell and the heating portion.

8. The quantum interference device according to claim 1, wherein the heating portion is separated from the gas cell.

9. An atomic oscillator, comprising:
the quantum interference device according to claim 1.

10. An atomic oscillator, comprising:
the quantum interference device according to claim 2.

11. A moving object, comprising: the quantum interference device according to claim 1.

12. A moving object, comprising: the quantum interference device according to claim 2.

\* \* \* \* \*